(12) United States Patent
Shimura

(10) Patent No.: US 9,136,205 B2
(45) Date of Patent: Sep. 15, 2015

(54) SEMICONDUCTOR DEVICE

(75) Inventor: Tadayuki Shimura, Kanagawa (JP)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 705 days.

(21) Appl. No.: 13/451,766

(22) Filed: Apr. 20, 2012

(65) Prior Publication Data

US 2012/0267795 A1  Oct. 25, 2012

(30) Foreign Application Priority Data

Apr. 21, 2011 (JP) ................................. 2011-095345

(51) Int. Cl.
*H01L 21/70* (2006.01)
*H01L 23/482* (2006.01)

(52) U.S. Cl.
CPC ........ *H01L 23/4821* (2013.01); *H01L 23/4824* (2013.01); *H01L 2924/0002* (2013.01)

(58) Field of Classification Search
CPC .................... H01L 23/4821; H01L 23/4824
USPC .................... 257/522, 276, E23.013
See application file for complete search history.

(56) References Cited

U.S. PATENT DOCUMENTS

| | | | | |
|---|---|---|---|---|
| 5,646,450 A * | 7/1997 | Liles et al. | ..................... | 257/776 |
| 5,683,546 A * | 11/1997 | Manaka | ............................. | 216/2 |
| 5,818,077 A * | 10/1998 | Takahashi et al. | ............ | 257/276 |
| 6,201,283 B1 * | 3/2001 | Lai et al. | ........................ | 257/410 |
| 6,424,006 B1 * | 7/2002 | Ponse | ............................ | 257/341 |
| 7,049,219 B1 * | 5/2006 | Farrar | ............................ | 438/619 |

FOREIGN PATENT DOCUMENTS

| JP | 06-084955 A | | 3/1994 |
|---|---|---|---|
| JP | 08-172104 A | | 7/1996 |
| JP | 10-070189 A | | 3/1998 |
| JP | 2006-080308 A | | 3/2006 |
| JP | 2010027909 A | * | 2/2010 |

OTHER PUBLICATIONS

Notification of Reason(s) for Refusal dated Dec. 9, 2014, issued in Japanese Patent Application No. 2011-095345, with English translation (4 pages).

* cited by examiner

*Primary Examiner* — Mark Tornow
*Assistant Examiner* — Abbigale Boyle
(74) *Attorney, Agent, or Firm* — Westerman, Hattori, Daniels & Adrian, LLP

(57) ABSTRACT

A semiconductor device includes a semiconductor layer, an active region defined in the semiconductor layer, first fingers provided on the active region and arranged in parallel with respect to a first direction, second fingers provided on the active region and interleaved with the first fingers, a bus line that is provided on an outside of the active region and interconnects the first fingers, first air bridges that are provided on the outside of the active region and are extended over the bus line, and that are connected to the second fingers, and second air bridges that are provided on the outside of the active region and are arranged in a second direction which crosses to the first direction, and that interconnect the first air bridges.

9 Claims, 5 Drawing Sheets

US 9,136,205 B2

SEMICONDUCTOR DEVICE

CROSS-REFERENCE TO RELATED APPLICATION

This application is based upon and claims the benefit of priority of the prior Japanese Patent Application No. 2011-095345 filed on Apr. 21, 2011, the entire contents of which are incorporated herein by reference.

BACKGROUND (i) Technical Field

A certain aspect of the embodiments discussed herein relates to semiconductor devices. Another aspect of the embodiments discussed herein relates to a semiconductor device having a multi-finger structure.

(ii) Related Art

As semiconductor devices suitable for amplification in RF bands such as microwaves, quasi-millimeter waves or millimeter waves, there is a known a field effect transistor (FET) such as a high electron mobility transistor (HEMI).

For example, Japanese Patent application Publication No. 8-172104 (Document 1) discloses an FET having a multi-finger structure having a plurality of gate fingers extending in parallel with each other, in which a source finger and a drain finger are respectively provided at opposite longitudinal sides of one gate finger so as to face each other across this gate finger.

The FET having the multi-finger structure has a source bus line interconnecting a plurality of source fingers, a drain bus line interconnecting a plurality of drain fingers, and a gate bus line interconnecting a plurality of gate bus lines. In an arrangement in which one source finger and one drain finger are opposite to each other across one gate finger, any of the source finger, the gate finger and the drain finger crosses any of the source bus line, the drain bus line and the gate bus line. For example, FIG. 1 of Document 1 discloses that the drain fingers and the source bus line cross each other.

In Document 1, in order to avoid a contact between the drain fingers and the source bus line, air bridges are provided in areas in which the drain fingers and the source bus line cross each other. However, the structure disclosed in Document 1 fails to realize a strong mechanical strength of the air bridges, and has a possibility that the air bridges may be crushed due to external force applied thereto.

SUMMARY

According to an aspect of the present invention, there is provided a semiconductor device includes a semiconductor layer, an active region defined in the semiconductor layer, first fingers provided on the active region and arranged in parallel with respect to a first direction, second fingers provided on the active region and interleaved with the first fingers, a bus line that is provided on an outside of the active region and interconnects the first fingers, first air bridges that are provided on the outside of the active region and are extended over the bus line, and that are connected to the second fingers, and second air bridges that are provided on the outside of the active region and are arranged in a second direction which crosses to the first direction, and that interconnect the first air bridges.

DETAILED DESCRIPTION

First Embodiment

Figure 1:
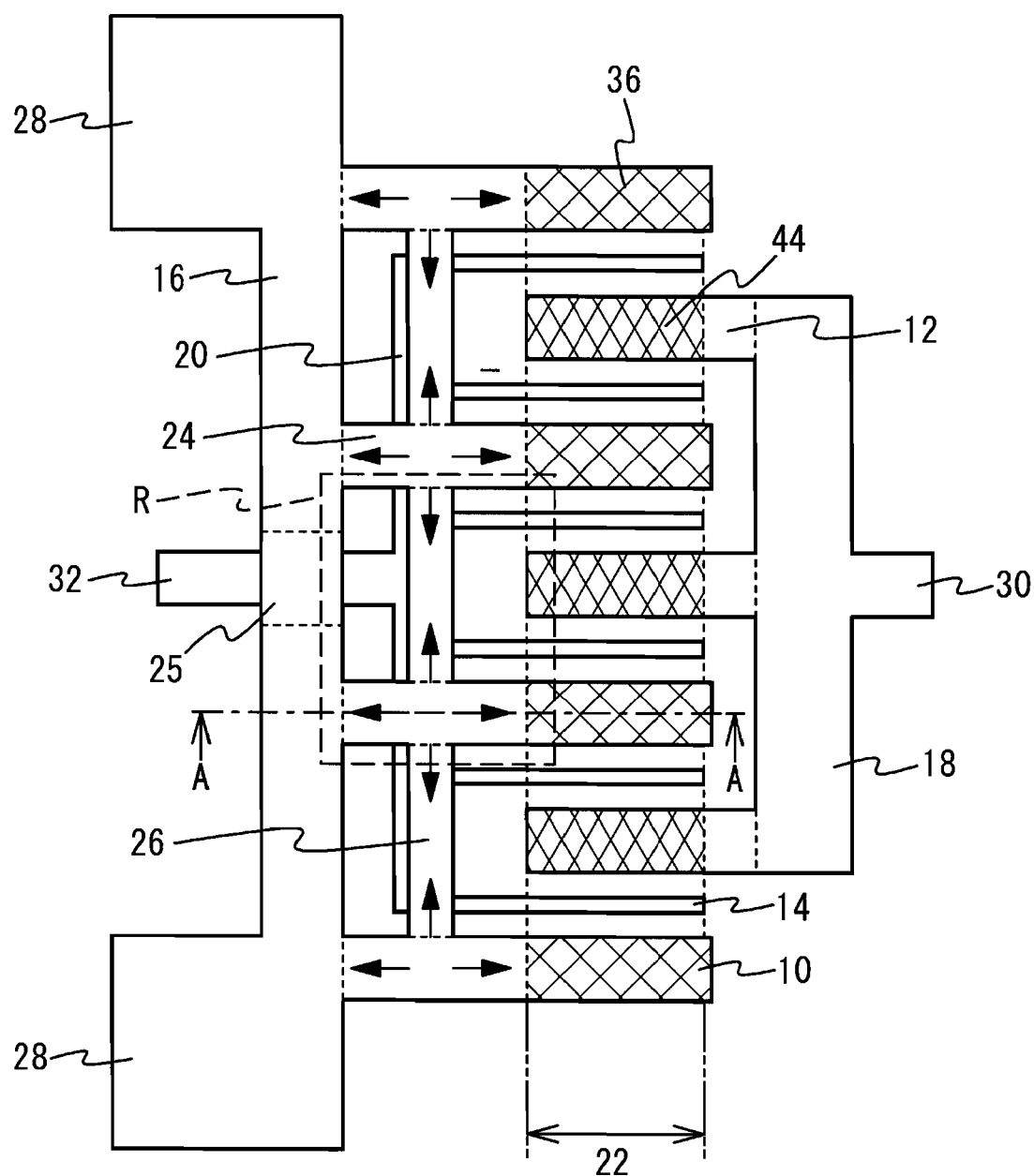
FIG. 1 is a schematic plan view of a semiconductor device in accordance with a first embodiment.
Figure 2:
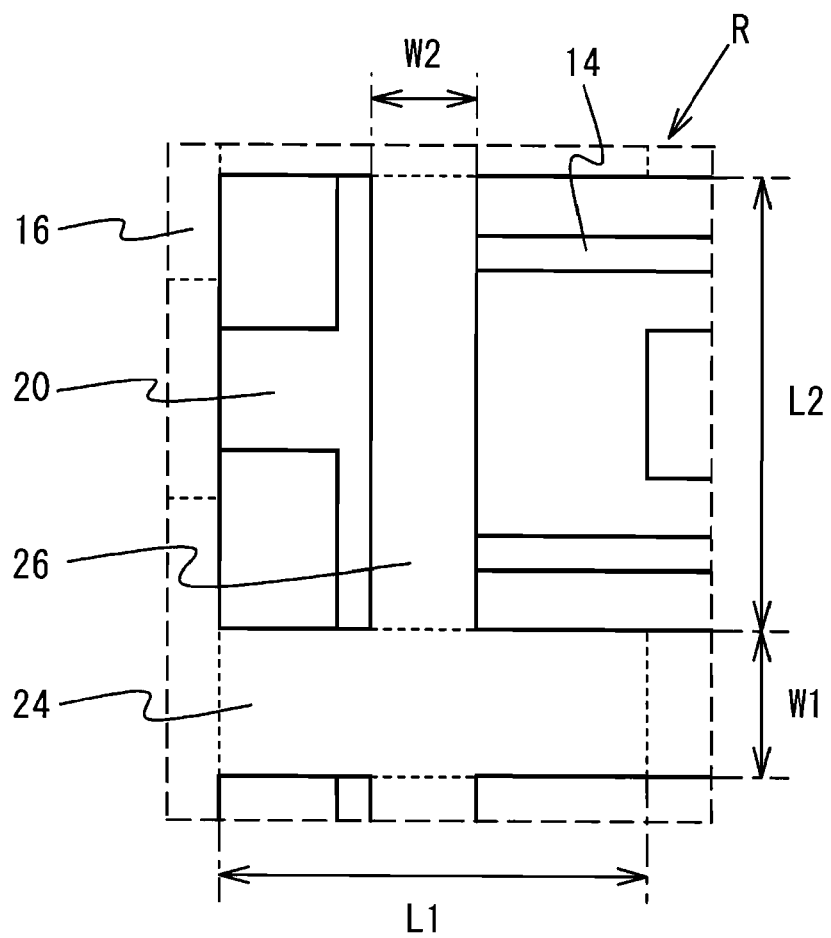
FIG. 2 is an enlarged view of an area R indicated by a broken line in FIG. 1.

FIG. 1 is a schematic plan view of a semiconductor device in accordance with a first embodiment. FIG. 2 is an enlarged view of an area R indicated by a broken line in FIG. 1. The number of fingers is not limited to that illustrated in FIG. 1, but the semiconductor device has an arbitrary number of fingers. As illustrated in FIG. 1, the semiconductor device of the first embodiment has a plurality of source fingers 10, a plurality of drain fingers 12, and a plurality of gate fingers 14, which are provided on a semiconductor layer including a GaAs channel layer and an AlGaAs electron supply layer. The source fingers 10 are connected to a source bus line 16 that extends in a first direction (the vertical direction in FIG. 1), and are arranged in parallel with each other so as to extend from the source bus line 16 in a second direction that crosses the first direction at the right angle (the second direction is the horizontal direction in FIG. 1).

The drain fingers 12 are arranged in parallel with each other so as to be interleaved with the source fingers 10. The drain fingers 12 are connected to a drain bus line 18 extending in the first direction, and extend from the drain bus line 18 in the second direction orthogonal to the first direction.

The gate fingers 14 are arranged in parallel with each other so that each of the gate fingers 14 is interposed between one of the source fingers 10 and one of the drain fingers 12. The gate fingers 14 are connected to the gate bus line 20 extending in the first direction, and extend in the second direction from the gate bus line 20.

The source bus line 16 and the drain bus line 18 are provided at opposite sides of an active region 22 obtained by activating a semiconductor layer. The gate bus line 20 is provided at the side of the active region 22 at which the source bus line 16 is provided. The source bus line 16 and the gate bus line 20 are arranged in this order from the active region 22. Thus, the source fingers 10 that extend from the source bus line 16 in the second direction cross the gate bus line 20.

In areas where the source fingers 10 and the gate bus line 20 cross each other, first air bridges 24 are provided in the source fingers 10. As illustrated in FIG. 2, the width W1 of the first air bridges 24 is 8 μm, for example, and the length L1 thereof is, for example, 30 μm. The first air bridges 24 extend over the gate bus line 20 so as to have a gap between the first air bridges 24 and the gate bus line 20. It is thus possible to prevent the source fingers 10 and the gate bus line 20 from being brought into contact with each other. The first air bridges 24 are capable of having small capacitances (source-gate capacitances) between the source fingers 10 and the gate bus line 20, as compared with a case where an insulative film is provided between the source fingers 10 and the gate bus lines 20 to avoid contacting. As illustrated in FIG. 1, the outermost source fingers 10 do not cross the gate bus line 20. However, the outermost source fingers 10 are provided with the first air bridge 24 in order to define a certain spacing between second air bridges 26 (which will be described later) and the gate bus line 20 and between the second air bridges 26 and the gate fingers 14.

One second air bridge 26 is provided between the two adjacent first air bridges 24. The second air bridge 26 has two ends, one of which is supported by one of the two adjacent first air bridges 24, and the other end is supported by the other adjacent first air bridge 24. The first air bridges 24 and the second air bridges 26 are simultaneously formed by a liftoff process using resist. The second air bridges 26 are supported in center portions of the first air bridges 24 in the direction in which the first air bridges 24 extend (in the second direction). That is, the second air bridges 26 connect the center portions of the first air bridges 24 together in the direction in which the first air bridges 24 extend. As illustrated in FIG. 2, the width W2 of the second air bridges 26 is, for example, 8 μm, and the length L2 thereof is, for example, 18 μm. The second air bridges 26 connect all the first air bridges 24 provided in the source fingers 10 together. Since the ends of the second air bridges 26 are supported by the first air bridges 24, the second air bridges 26 are provided so as to be spaced away from the gate bus line 20 and the gate fingers 14. That is, each of the second air bridges 26 connects the adjacent first air bridges 24, and a spacing is formed between each second air bridge 26 and the semiconductor layer. It is therefore possible to prevent the second air bridges 26 and the gate bus line 20 from being brought into contact with each other and to prevent the second air bridges 26 and the gate fingers 14 from being brought into contact with each other. It is further possible to reduce the capacitances between the second air bridges 26 and the gate bus line 20 and those between the second air bridges 26 and the gate fingers 14 (that is, the source-gate capacitances).

The source fingers 10 include source electrodes 36, which are ohmic electrodes provided in contact with the semiconductor layer in the active region 22. The drain fingers 12 include drain electrodes 44, which are ohmic electrodes provided in contact with the semiconductor layer in the active region 22. The details of the source fingers 10 will be described later.

Both end portions 28 of the source bus line 16 in the first direction function as source pads. A center portion 30 of the drain bus line 18 in the first direction, which portion is extended to a side opposite to the active region 22, functions as a drain pad. A center portion 32 of the gate bus line 20 in the first direction, which portion is extended to a side opposite to the active region 22 and crosses the source bus line 16, functions as a gate pad. In an area in which the source bus line 16 and the gate bus line 20 cross each other, an air bridge 25 is provided in the source bus line 16.

Figure 3:
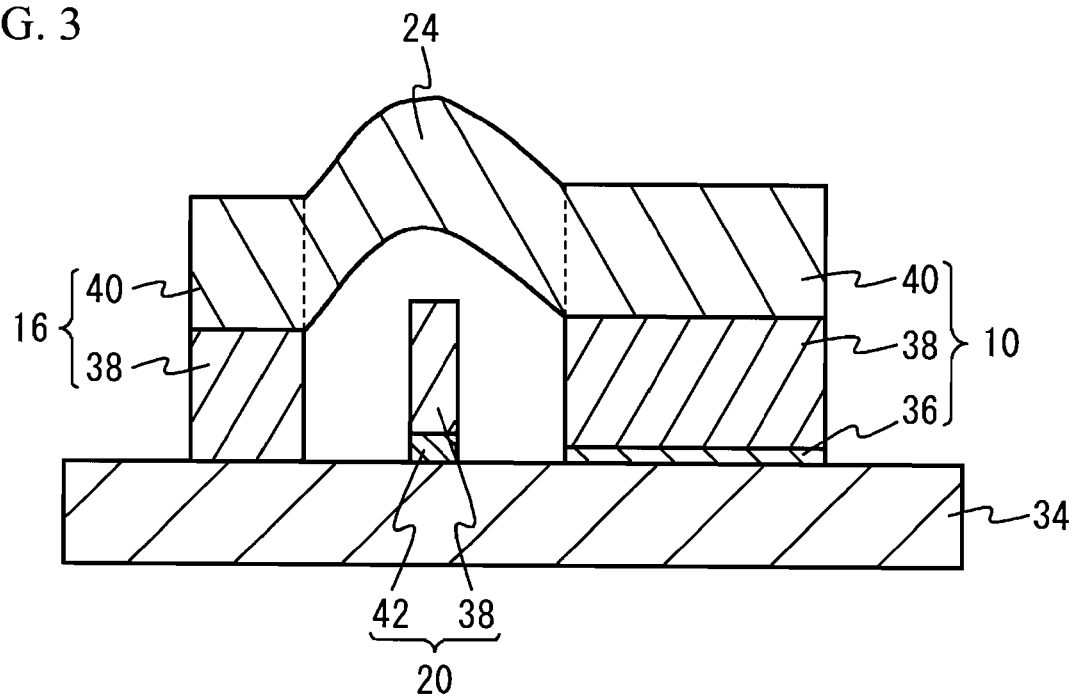
FIG. 3 is a schematic cross-sectional view taken along a line A-A in FIG. 1.

FIG. 3 is a schematic cross-sectional view taken along a line A-A in FIG. 1. An illustration of a semi-insulative substrate below a semiconductor layer 34 is omitted. Referring to FIG. 3, the semiconductor layer 34 includes a GaAs channel layer formed on a semi-insulative substrate such as a GaAs substrate, and an AlGaAs electron supply layer provided on the GaAs channel layer. The source bus line 16 that extends in the first direction and the gate bus line that extends in the first direction are provided on the semiconductor layer 34. The source fingers 10 extend from the source bus line 16 in the second direction, and cross the gate bus line 20. In areas where the source fingers 10 and the gate bus line 20 cross each other, the first air bridges 24 are provided in the source fingers 10. The first air bridges 24 are provided so as to extend over with spacings formed along with the gate bus line 20. With this structure, it is possible to prevent the source fingers 10 and the gate bus line 20 from being brought into contact with each other and to reduce the source-gate capacitances.

The source fingers 10 are each composed of a source electrode 36 provided in the active region 22 of the semiconductor layer 34, a lower interconnection layer 38 provided on the source electrode 36, and an upper interconnection layer 40 that extends on the lower interconnection layer 38 from the source bus line 16. In other words, the source fingers 10 are configured so that the lower interconnection layer 38 is provided on the source electrode 36, which is an ohmic electrode in the active region of the semiconductor layer 34, and the upper interconnection layer 40 on the lower interconnection layer 38. The first air bridges 24 are formed by only the upper interconnection layer 40, while the lower interconnection layer 38 is not used. The second air bridges 26 interposed between the adjacent first air bridges 24 are formed by only the upper interconnection layer 40, while the lower interconnection layer 38 is not used. That is, the first air bridges 24 and the second air bridges 26 are simultaneously formed, and have an equal thickness. The source electrode 36 has a multilayered structure composed of, for example, AuGe, Ni and Au stacked in this order from the semiconductor layer 34 side, and has a thickness of 0.2 μm, for example. The lower interconnection layer 38 has a multilayered structure composed of, for example, TiW and Au stacked in this order from the source electrode 36 side, and has a thickness of 3 μm, for example. The upper interconnection layer 40 has a multilayered structure composed of, for example, TiW and Au stacked in this order from the lower interconnection layer 38 side, and has a thickness of 1.2 μm, for example.

The source bus line 16 is composed of the lower interconnection layer 38 and the upper interconnection layer 40 provided thereon. The gate bus line 20 is composed of a gate interconnection layer 42 and the lower interconnection layer 38 provided on the gate interconnection layer 42. The gate interconnection layer 42 has a multilayered structure composed of, for example, WSi and Au stacked in this order from the semiconductor layer 34 side, and has a thickness of 0.5 μm, for example. The gate fingers 14 extending from the gate bus line 20 in the second direction are formed by only the gate interconnection layer 42. The source electrode 36 and the gate interconnection layer 42 are formed by separate steps. The lower interconnection layer 38 of the source bus line 16 and the gate interconnection layer 42 of the gate bus line 20 are provided so as to contact the semiconductor layer 34. Areas in the semiconductor layer 34 that contact the lower interconnection layer 38 and the gate interconnection layer 42 are high-resistance regions into which boron is implanted.

The lower interconnection layers 38 respectively included in the source fingers 10, the source bus line 16 and the gate bus line 20 are simultaneously formed and have an equal thickness. The upper interconnection layers 40 respectively included in the source fingers 10, the source bus line 16 and the second air bridges 26 are simultaneously formed and have an equal thickness.

Figure 4:
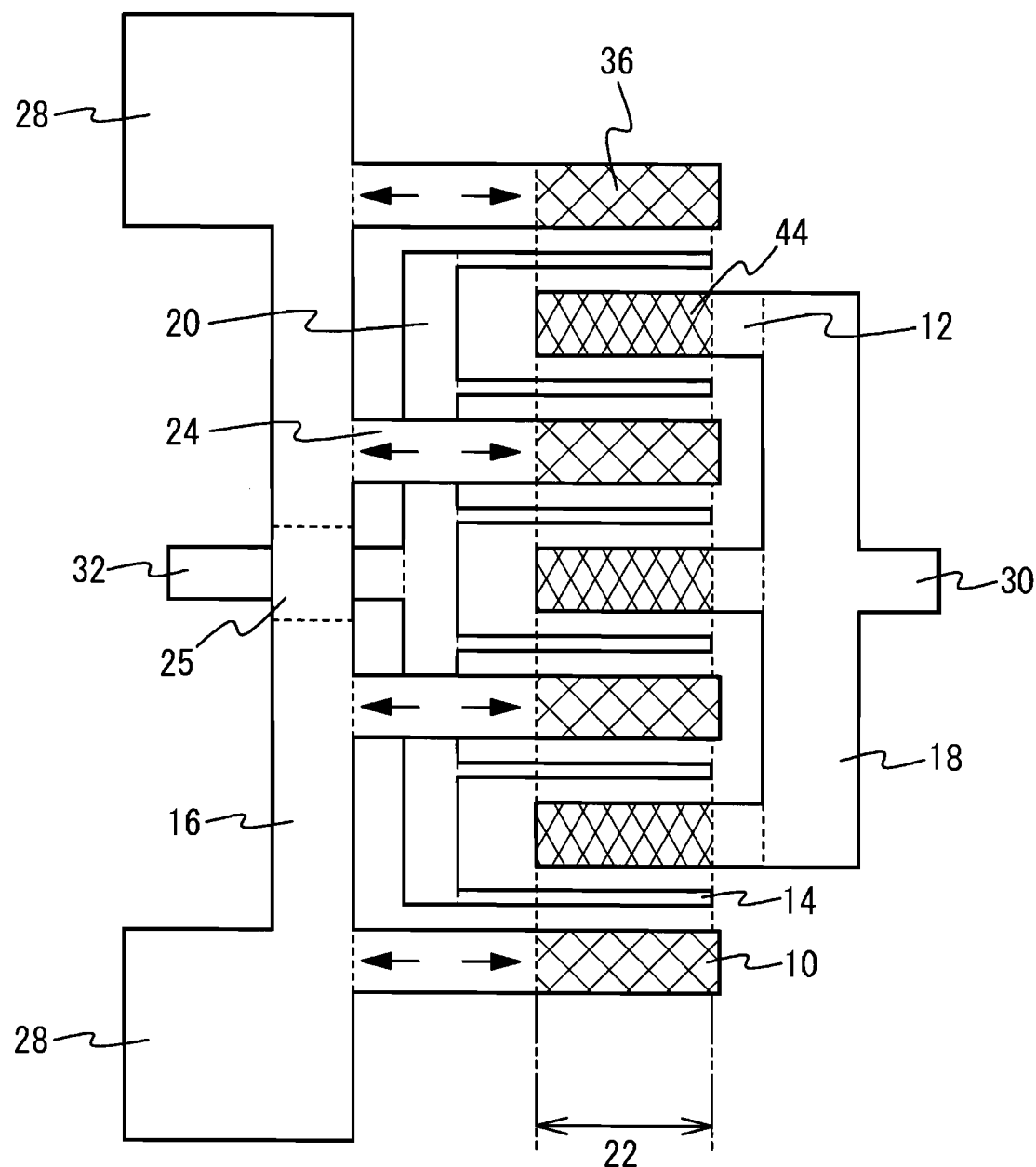
FIG. 4 is a schematic plan view of a semiconductor device in accordance with a first comparative example.

Now, a description is given of a semiconductor device in accordance with a first comparative example that is referred to in order to describe effects of the semiconductor device in accordance with the first embodiment. FIG. 4 is a schematic plan view of a semiconductor device in accordance with the first embodiment. Referring to FIG. 4, the semiconductor device of the first comparative example does not have the second air bridges 26. The other structures of the first comparative example are the same as those of the first embodiment, and are illustrated in FIGS. 1 through 3.

The inventors measured the ratio of the occurrence of crush of the first air bridges 24 of the semiconductor device of the first embodiment and that of the first comparative example at the time of completion of the manufacturing process. In the measurement of the occurrence of crush of the first air bridges 24, chips each having 180 first air bridges 24 were prepared. Every chip having at least one of the first air bridge 24 that has been crushed was handled as a defective chip. Table 1 shows measurement results. The ratio of occurrence of crush in the semiconductor devices of the first comparative example (the ratio of the occurrence of defective chips) is 46.2%, while that of the semiconductor devices of the first embodiment is 16.0%. The following is the reason why the first embodiment can reduce the ratio of the occurrence of crush as compared with the first comparative example.

TABLE 1

|  | 1st embodiment | 1st comparative example |
|---|---|---|
| Ratio of occurrence of crush | 16.0% | 46.2% |

In the semiconductor devices of the first comparative example, when an external force is applied to the first air bridges 24, as indicated by arrows in FIG. 4, the force is distributed in the direction in which the first air bridges 24 extend. In contrast, when an external force is applied to the first air bridges 24 of the semiconductor devices of the first embodiment, as indicated by arrows in FIG. 1, the force is distributed in the direction in which the second air bridges 26 extend in addition to the direction in which the first air bridges 24 extend. According to the first embodiment, the distribution of the external force is facilitated, whereby the mechanical strength is improved and the ratio of occurrence of crush is reduced, as compared with the first comparative example.

As described above, as illustrated in FIGS. 1 and 3, the first embodiment is configured to have the plurality of source fingers 10, the plurality of drain fingers 12 and the plurality of gate fingers 14 on the semiconductor layer 34. The source fingers 10 are arranged in parallel with each other. The drain fingers 12 are interleaved with the source fingers 10. Each of the gate fingers 14 is interposed between the adjacent source finger 10 and the drain finger 12. The first air bridges 24 are provided in the source fingers in the areas in which the source fingers 10 extend over the gate bus line 20 with the spacings. The first air bridges 24 are connected together, and the second air bridges 26 are provided so as to be spaced apart from the semiconductor layer 34. With the above-described structure, it is possible to facilitate the distribution of external force applied to the air bridges 24 and to improve the mechanical strength of the first air bridges 24. Thus, the ratio of occurrence of crush of the first air bridges 24 can be improved.

As illustrated in FIG. 1, the second air bridges 26 are preferably interposed between the adjacent first air bridges 24. In this case, the distribution of external force applied to the first air bridges is facilitated, so that the mechanical strength of the first air bridges 24 can be further improved. The arrangement of the second air bridges 26 is not limited to the above. For example, at least one of the second air bridges 26 is connected to at least one of the first air bridges 24.

As illustrated in FIG. 1, the second air bridges 26 are preferably supported by the center portions of the first air bridges 24 in the direction in which the first air bridges 24 extend. That is, it is preferable that the second air bridges 26 connect the center portions of the first air bridges 24 in the direction in which the first air bridges 24 extend. The first air bridges 24 have a comparatively weak mechanical strength in the center portions in the direction in which the first air bridges 24 extend. Therefore, the second air bridges 26 are connected to the center portions of the first air bridges 24 to distribute the external force applied to the first air bridges 24, which has an improved mechanical strength. The second air bridges 26 may be connected to portions of the first air bridges 24 that are off the center portions. The second air bridges 26 may have portions connected to the center portions of the first air bridges 24 and the remaining portions connected to portions of the first air bridges 24 that are off the center portions. At least two second air bridges 26 may be provided between the adjacent first air bridges 24. Even in this arrangement, it is possible to facilitate the distribution of external force applied to the first air bridges 24 and to improve the mechanical strength of the first air bridges 24.

As illustrated in FIG. 3, the source fingers 10 provided with the first air bridges 24 are preferably composed of the source electrodes 36 (ohmic electrodes), the lower interconnection layer 38 provided on the source electrode 36 and the upper interconnection layer 40 provided thereon in the active region 22 in the semiconductor layer 34. The first air bridges 24 are preferably formed only by the upper interconnection layer 40, and the lower interconnection layer 38 is not used for the first air bridges 24. The gate bus line 20 is preferably formed by the gate interconnection layer 42 and the lower interconnection layer 38. It is thus possible to realize a small resistance of the gate bus line 20, as compared with an arrangement in which the gate bus line is formed by only the gate interconnection layer 42. When the gate bus line 20 is composed of the gate interconnection layer 42 and the lower interconnection layer 38 as described above, the first air bridges 24 are formed by the upper interconnection layer 40, as illustrated in FIG. 3. In this case, if the lower interconnection layer 38 is made thicker in order to reduce the resistance of the gate bus line 20, the upper interconnection layer 40 may be thinned in light of viewpoints in manufacturing such as the aspect ratio. For example, the thickness of the upper interconnection layer 40 may be smaller than that of the lower interconnection layer 38. As the upper interconnection layer 40 is thinner, the mechanical strength of the air bridges 24 is weaker. Thus, in such a case, as illustrated in FIG. 1, it is useful to employ the second air bridges 26 in order to improve the strength of the first air bridges 24.

Figure 5:
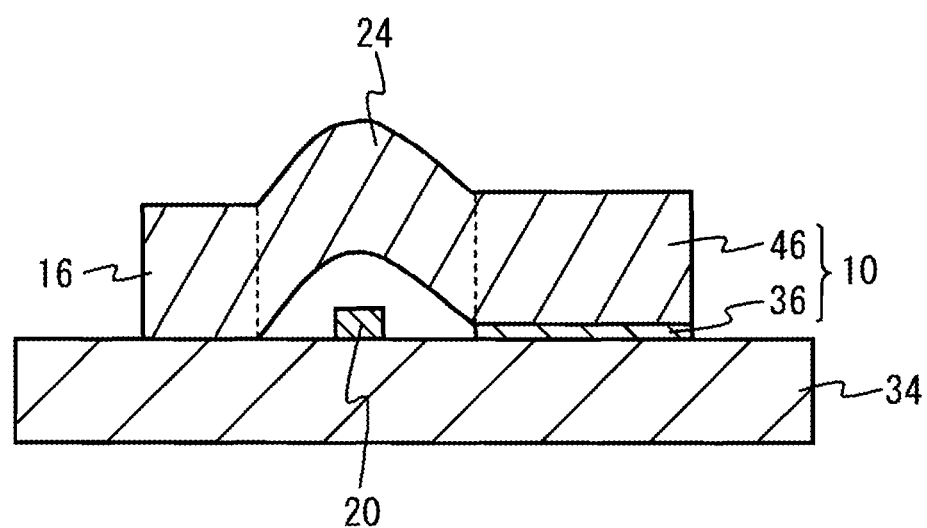
FIG. 5 is a schematic cross-sectional view of an arrangement in which an identical layer is used to form an interconnection layer provided in an active region in a semiconductor layer and an interconnection layer that forms an air bridge.

FIG. 5 is a schematic cross-sectional view of an arrangement in which the interconnection layers provided in the active region 22 of the semiconductor layer 34 have the same interconnection layer as the first air bridges 24. As illustrated in FIG. 5, the source bus line 16 extending in the first direction and the gate bus line 20 extending in the first direction are provided on the semiconductor layer 34. The source finger 10 extends from the source bus line 16 in the second direction. The source finger 10 is composed of the source electrode 36 provided in the active region 22, and the interconnection layer 46 that extends on the source electrode 36 from the source bus line 16. The first air bridge 24 is formed by the interconnection layer 46. The source finger 10 includes the interconnection layer 46 on the source electrode (ohmic electrode) 36 in the active region 22 of the semiconductor layer 34. The first air bridge 24 in the source finger 10 is formed by only the interconnection layer 46. The interconnection layer 46 in the active region 22 and the interconnection layer 46 that forms the air bridge 24 are simultaneously formed, and are equal to each other in thickness. The source electrode 36 may have a multilayered structure composed of, for example, AuGe, Ni and Au stacked in this order from the semiconductor layer 34 side and may have a thickness of, for example, 0.2 μm. The interconnection layer 46 may have a multilayered structure composed of, for example, TiW and Au stacked in this order from the source electrode 36 side, and may have a thickness of, for example, 3 μm.

The source bus line 16 is formed by the interconnection layer 46. The gate bus line 20 is formed by the gate interconnection layer. The gate interconnection layer may have a multilayered structure composed of WSi and Au stacked in this order from the semiconductor layer 34 side, and may have a thickness of, for example, 0.5 μm. The gate fingers 14 extending from the gate bus line 20 in the second direction is formed by the gate interconnection layer.

As illustrated in FIG. 5, the source finger 10 in which the first air bridge 24 is provided has the interconnection layer 46 on the source electrode 36 (ohmic electrode) in the active region 22 of the semiconductor layer 34, and the first air bridge 24 is formed by only the interconnection layer 46. The first air bridge 24 may be configured to have the same thickness as that of the interconnection layer 46 provided on the source electrode 36. In this case, the interconnection layer 46 on the source electrode 36 and the first air bridge 24 may be formed by the same process, which simplifies the manufacturing process. In order to avoid the occurrence of crush of the first air bridges 24, as illustrated in FIG. 1, it is preferable to provide the second air bridges 26 in order to improve the strength of the first air bridges 24.

The first embodiment described above has exemplary dimensions in which the width of the first air bridges 24 is 8 μm, the length thereof is 30 μm, the thickness thereof is 1.2 μm and the ratio of the length to the product of the thickness and width (thickness×width/length) is 0.32. However, the present embodiment is not limited to the above dimensions. For example, the first air bridges 24 may be configured to have a width of 3 μm, a length of 5-15 μm, and a thickness of 1 μm. In this case, the ratio of the length to the product of the thickness and the width of the first air bridges 24 is 0.2-0.6. According to the inventors' knowledge, the ratio of the length to the product of the thickness and width of the first air bridges 24 is preferably in the range of 0.1 to 0.6, and is more preferably in the range of 0.2 to 0.5. The reason why the ratio is preferably in the for the range of 0.1 to 0.6 is that the first air bridges 24 are mechanically weak and are likely to be crushed in the range of 0.1 to 0.6 although a ratio over 0.6 increases the mechanical strength of the first air bridges 24. The ratio of 0.1 is determined by considering a case where, in the first air bridges 24, the minimum width is 3 μm, the minimum thickness is 1 μm and the maximum length is 30 μm. In a case where the ratio of the length to the product of the thickness and width of the first air bridges 24 is 0.1-0.6, as illustrated in FIG. 1, the second air bridges 26 are preferably employed in order to improve the strength of the first air bridges 24.

The first embodiment is not limited to the specifically arrangement in which the source fingers 10 and the gate bus line 20 cross each other, and the first air bridges 24 are provided in the source fingers 10. Another exemplary arrangement may be configured so that the source fingers 10 and drain bus line 18 cross each other, and the first air bridges 24 are provided in the source fingers 10. Yet another exemplary arrangement may be configured so that the drain finger 12 and the source bus line 16 or the gate bus line 20 cross each other, and the first air bridges 24 are provided in the drain fingers 12. A further exemplary arrangement may be configured so that the gate fingers 14 and the source bus line 16 or the drain bus line 18 cross each other, and the first air bridges 24 are provided in the gate fingers 14. That is, the first air bridges 24 are provided in any of the source fingers 10, the drain fingers 12 and the gate fingers 14, and extend over the bus line that is one of the source bus line 16, the drain bus line 18 and the gate bus line 20 and is used to interconnect any of the fingers other than the fingers in which the first air bridges 24 are provided so as to be spaced apart from the above bus line.

In the case where the first air bridges 24 are provided in the drain fingers 12, as in the case of FIG. 3, it is preferable that the drain fingers 12 are composed of the lower interconnection layer 38 formed on the drain electrode 44 (ohmic electrode) and the upper interconnection layer 40 provided on the lower interconnection layer 38 in the active region 22 of the semiconductor layer 34. The first air bridges 24 are preferably formed by only the upper interconnection layer 40 and the lower interconnection layer 38 is not used. The gate bus line 20 is preferably composed of the gate interconnection layer and the lower interconnection layer 38 provided thereon. It is thus possible to reduce the resistance of the gate bus line 20 and to improve the first air bridges 24, which may be mechanically weak. As in the case of FIG. 5, the drain fingers 12 may be composed of the interconnection layer 46 on the drain electrode 44 (ohmic electrode) in the active region 22 in the semiconductor layer 34, and the first air bridges 24 are formed by only the interconnection layer 46. In this case, the first air bridges 24 have a thickness equal to that of the interconnection layer 46 provided on the drain electrode 44.

FIG. 1 illustrates an exemplary case where the source bus line 16, the drain bus line 18 and the gate bus line 20 extend in the same direction (first direction). The present embodiment is not limited to the above case, but the bus lines may extend in different directions. The source fingers 10 are not limited to the aforementioned parallel arrangement but may extend in different directions. Similarly, the drain fingers 12 and the gate fingers are not limited to the parallel arrangement but may extend in different directions. It is preferable that the source fingers 10, the drain fingers 12 and the gate fingers 14 are arranged in parallel with each other.

The semiconductor layer 34 is not limited to the aforementioned structure including the GaAs channel layer and the AlGaAs electron supply layer, but may have another structure. For example, the semiconductor layer 34 may include a GaN channel layer and an AlGaN electron supply layer. Also, the semiconductor layer 34 may include III-V compound semiconductor including arsenic such as GaAs, InAs, AlAs, InGaAs, AlGaAs, or InAlGaAs or may include III-V compound semiconductor including nitrogen such as GaN, InN, AlN, AlGaN, InGaN or AlInGaN.

Second Embodiment

Figure 6:
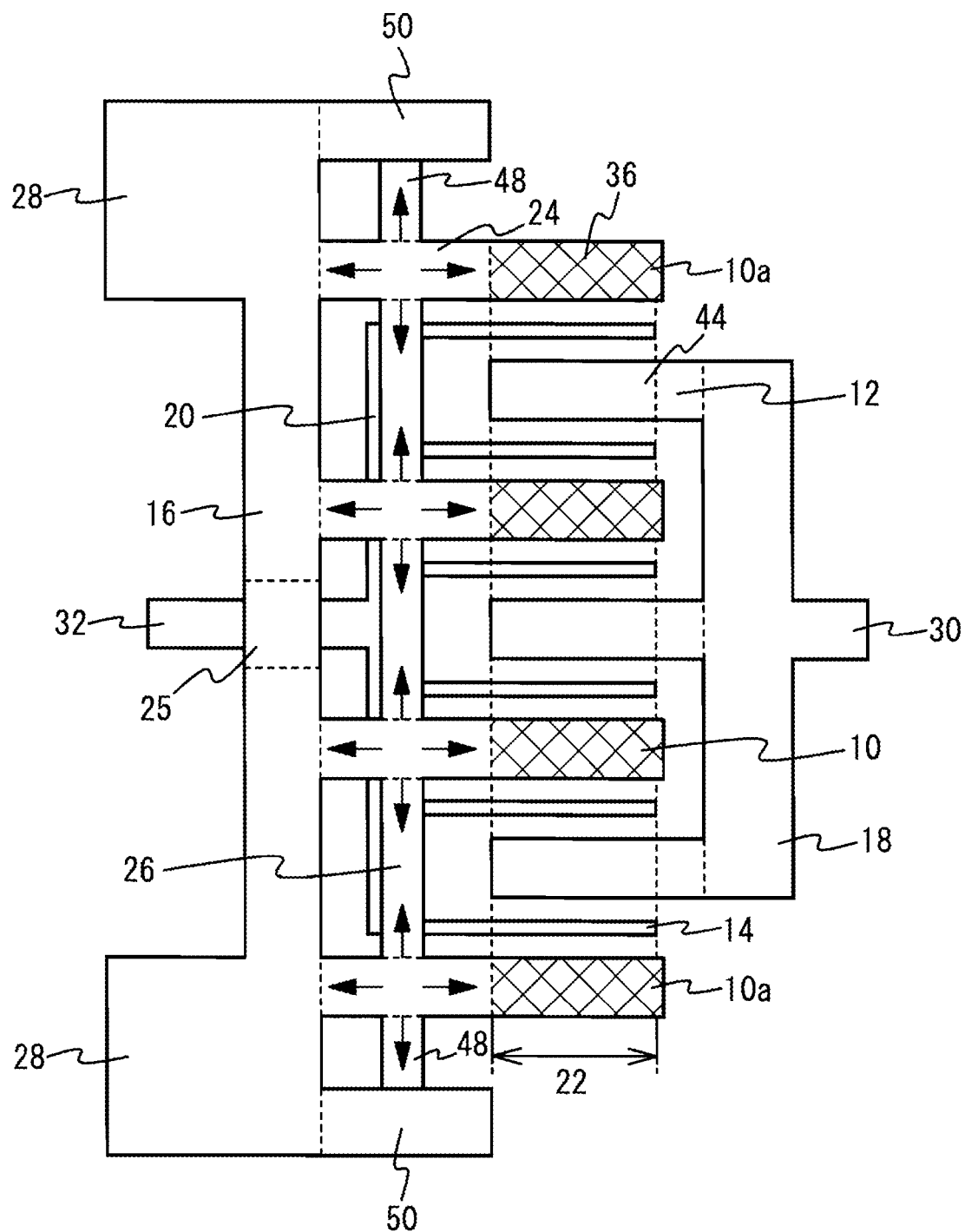
FIG. 6 is a schematic plan view of a semiconductor layer in accordance with a second embodiment.

FIG. 6 is a schematic plan view of a semiconductor device in accordance with a second embodiment. The number of fingers is not limited to that illustrated in FIG. 6, but the semiconductor device has an arbitrary number of fingers. As illustrated in FIG. 6, the semiconductor device of the second embodiment third air bridges 48 that are located further out than the outermost source fingers 10a among the source fingers 10 in the first direction. Each of the third air bridges 48 is supported by the first air bridge 24 provided in the corresponding outermost source finger 10a at one end and by a fixing portion 50 provided in the semiconductor layer 34 at the other end. That is, the third air bridges 48 connect the fixing portions 50 and the outermost first air bridges 24. One end of each of the third air bridges 48 is supported by the center portion of the first air bridge 24 in the direction in which the first air bridge 24 extends. That is, the third air bridges 48 are connected to the center portions of the outermost air bridges 24. The fixing portions 50 are formed integrally with the source bus line 16. That is, the fixing portions 50 are formed simultaneously with the source bus line 16, and are composed of the lower interconnection layer 38 and the upper interconnection layer 40. Like the second air bridges 26, the third air bridges 48 are formed by the upper interconnection layer 40. That is, the first air bridges 24, the second air bridges 26 and the third air bridges 48 are simultaneously formed by liftoff using resist and are equal to each other in thickness. The other structures of the second embodiment are the same as those of the first embodiment, and a description thereof is omitted here.

In the semiconductor device of the first embodiment, external force applied to the first air bridges 24 is distributed in the direction in which the first air bridges 24 extend and in the direction in which the second air bridges 26 extend. In this case, the external force is distributed in four directions in the first air brides 24 that are located further in than the outermost first air bridges 24 in the first direction. In contrast, the external force is distributed in only three directions in the outermost first air bridges 24. Thus, the outermost air bridges 24 may be likely to be crushed, as compared with the first air bridges 24 located further in than the outermost first air bridges 24.

In contrast, according to the second embodiment, as illustrated in FIG. 6, the third air bridges 48 connect the fixing portions 50 located further out than the outermost first air bridges 24 in the first direction and the outermost air bridges 24. The third air bridges 48 make it possible to distribute external force applied to the outermost first air bridges 24 in the first direction to four directions. It is thus possible to improve the outermost first air bridges 24 in the first direction to a strength as large as the mechanical strengths of the first air bridges 24 located further in than the outermost first air bridges 24. It is thus possible to improve the whole strength of the plurality of first air bridges 24.

As illustrated in FIG. 6, the third air bridges 48 are connected to the center portions of the first air bridges 24 in the direction in which the first air bridges 24 extend. Since the center portions of the first air bridges 24 are comparatively weak, the third air bridges 48 connected to the outermost first air bridges 24 are capable of further improving the strength of the outermost first air bridges 24. The third air bridges 48 may be connected to portions of the first air bridges 24 that are located off the center portions. Even in this case, the outermost first air bridges 24 may be improved to have a mechanical strength as large as those of the first air bridges 24 located further in than the outermost air bridges 24. It is also possible to connect at least two third air bridges 48 to one of the outermost first air bridges 24.

In the aforementioned semiconductor device of the second embodiment, the fixing portions 50 are integrally formed with the source bus line 16 and are composed of the lower interconnection layer 38 and the upper interconnection layer 40 as in the case of the source bus line 16. However, the second embodiment is not limited to the above, but may be varied. For example, the fixing portions 50 may not be connected to the source bus line 16 or may have a layer structure or material different from that of the source bus line 16. The fixing portions 50 may be provided on the semiconductor layer 34 so as to fix the third air bridges 48 to the semiconductor layer 34.

The width of the third air bridges 48 is preferably equal to that of the second air bridges 26. It is preferable that the length of the third air bridges 48 is approximately half the length of the first air bridges 24 in order to distribute external force exerted on the first air bridges 24 and thus improve the strength of the first air bridges 24.

The present invention is not limited to the specifically described embodiments, but may include other embodiments and variations without departing from the scope of the present invention.

What is claimed is:

1. A semiconductor device comprising:
   a semiconductor layer;
   an active region defined in the semiconductor layer;
   first fingers provided on the active region and arranged in parallel with respect to a first direction;
   second fingers provided on the active region and interleaved with the first fingers;
   a bus line that is provided on an outside of the active region and interconnects the first fingers;
   first air bridges that are provided on the outside of the active region and are extended over the bus line, and that are electrically connected to the second fingers; and
   second air bridges that are provided on the outside of the active region and are arranged in a second direction which crosses to the first direction, and that are electrically connected to the first air bridges,
   wherein the first fingers are gate fingers and the second fingers are source fingers or drain fingers,
   wherein the first air bridges and the second air bridges are connected at a cross point, the cross point is located at the first air bridge, and the cross point is separated from a surface of the semiconductor layer by air.

2. The semiconductor device according to claim 1, wherein:
   the second fingers are composed of a lower interconnection layer on an ohmic electrode and an upper interconnection layer provided on the lower interconnection layer in the active region in the semiconductor layer;
   the first air bridges are formed by only the upper interconnection layers; and
   the bus line is composed of a gate interconnection layer and the lower interconnection layer provided on the gate interconnection layer.

3. The semiconductor device according to claim 1, wherein:
   the second fingers have a structure that includes an interconnection layer on an ohmic electrode in the active region in the semiconductor layer; and
   the first air bridges have a thickness equal to that of the interconnection layer.

4. The semiconductor device according to claim 1, wherein the second air bridges connect center portions of the first air bridges.

5. The semiconductor device according to claim 1, further comprising:
   fixing portion provided outside of outermost one of the first air bridges; and
   third air bridges interconnecting the fixing portions and the outermost ones of the first air bridges.

6. The semiconductor device according to claim 5, wherein the second finger connected to the outermost one of the first air bridge is an outermost finger in the second fingers.

7. The semiconductor device according to claim 5, wherein the third air bridges are connected to center portions of the outermost ones of the first air bridges.

8. The semiconductor device according to claim 1, wherein a ratio of a length of the first air bridges to a product of a thickness and width thereof is 0.1-0.6.

9. The semiconductor device according to claim 1, wherein the bus line and the second air bridges are overlapped.

* * * * *